United States Patent [19]

Rothenberger

[11] Patent Number: 4,588,944

[45] Date of Patent: May 13, 1986

[54] FULLY SCAN-SET TESTABLE EMBEDDED EDGE-TRIGGERED DUAL D AND J-K FLIP-FLOPS THROUGH TESTING AS INVERTER STRINGS

[75] Inventor: Roland D. Rothenberger, Apple Valley, Minn.

[73] Assignee: Sperry Corporation, New York, N.Y.

[21] Appl. No.: 503,960

[22] Filed: Jun. 13, 1983

[51] Int. Cl.[4] ...................... G01R 31/28; H03K 19/00
[52] U.S. Cl. ..................................... 324/73 R; 371/25
[58] Field of Search ............ 324/73 R, 158 R, 73 AT; 371/15, 20, 24, 25; 364/489, 490; 365/154

[56] References Cited

PUBLICATIONS

Bodner, R., "100% Testable D-Type Flip-Flop", IBM Technical Disclosure Bulletin, vol. 15, No. 8, Jan. 1973, pp. 2487-2488.
Finlay, D., "Latch Circuit Operable as a D-Type Edge Trigger", IBM Technical Disclosure Bulletin, vol. 22, No. 12, May 1980, pp. 5261-5262.
McCluskey, E., "Built-In Self Test Structures", IEE Design & Test, Apr. 1985, pp. 29-36.
Stewart, J., "Future Testing of Large LSI Circuit Cards", Digest 1977 Semiconductor Test Symp., Cherry Hill, N.J., Oct. 1977, pp. 6-15.
Stewart, J., "Application of Scan/Set for Error Detection and Diagnostics", Digest 1978 Semiconductor Test Conf., Cherry Hill, N.J., Oct. 1978, pp. 152-158.

Primary Examiner—Stewart J. Levy
Assistant Examiner—Stephen M. Baker
Attorney, Agent, or Firm—William C. Fuess; Glenn W. Bowen

[57] ABSTRACT

Additional logical structures are respectively interactive with either an edge-triggered dual D-type flip-flop or an edge-triggered J-K flip-flop in order that each such flip-flop may be fully scan-set testable in all the elements thereof. Two scan-set test enabling signals, as well as two scan-set clock signal, are used to conduct three tests, as well as enabling normal edge-triggered operation. The three tests enable scan-set testability of the totality of the edge-triggered flip-flop. Two of the tests characteristically cause the logical interconnection of tested logical elements as inverter strings, which inverter strings are merged into the scan-set test loops. In addition to supporting functional logical verification, the inverter strings support the evaluation of propagation time upon such strings in order to determine the operational speed and/or impedance environment of the tested flip-flops. Marginal, as well as failed, flip-flops (flip-flop environments) are identifiable.

7 Claims, 9 Drawing Figures

FULLY SCAN-SET TESTABLE EMBEDDED EDGE-TRIGGERED DUAL D AND J-K FLIP-FLOPS THROUGH TESTING AS INVERTER STRINGS

BACKGROUND OF THE INVENTION

The present invention relates generally to the testability of digital logics circuitry and specifically to the scan-set testability of an embedded, edge-triggered flip-flop.

As digital logic circuits at all levels (chips, boards and subsystems), have become increasingly complex, the difficulty of thoroughly testing each level has markedly increased. As the gate-to-I/O pin ratio continues to increase with new technologies, the ability to control and observe internal modes of digital logic circuits continues to decrease. Where the ratio of logic gates to I/O pins is large, as in gate array technology, the utilization of the scan-test technique greatly increases the testability of a logic circuit, allowing nearly 100 percent coverage of the contained gates. The scan-set technique allows the internal registers of the circuit under test to be used as virtual I/O pins, thus reducing the logic gate-to-I/O pin ratio. This has the advantage of increasing the controllability of the digital logic circuit under test. The use of the scan-set technique eliminates the requirement for manual generation of test vectors for digital logic circuitry. Manual generation of test vectors is very undesirable because of the excessive amount of designer time required, and because of the potential inadequacy of test coverage.

Scan-set testability is implemented by utilization of flip-flops which have two inputs: a parallel data input for normal operation and a serial data input for scan-set test operation. The selection between the two data inputs, normal and scan-set data, is controlled by the distribution of functional clock and scan-set test enablement signals. The use of scan-set testable flip-flops provides two major advantages. The first advantage is to allow the utilization of such flip-flops during normal operation of the digital logics circuitry as latches or, combinatorially, as a functional register. The second advantage is to allow information to be shifted into the flip-flop (providing controllability) as well as allowing retrieval of information from the flip-flops (providing observability). The input function is termed "set" while the output shift is termed "scan". Both operations can be performed at once if the data to be input for the next test step may be anticipated while the output of the present step is being examined.

The flip-flops that have priorly been used in scan-set testable logic have previously been predominantly of the bistable type. The prior art bistable flip-flop exhibits the following characteristic: regardless of the time sequence between the clock signal and the data signal the output of such flip-flop is stable (which is not to say invariant, but only that no critical time relationship exists between the clock and data signals). Existing edge-triggered flip-flop, for example dual D-type positive-edge-triggered flip-flop with preset and clear industry standard part number 74, or additionally for example edge-triggered J-$\overline{K}$ flip-flop industry standard part number 109, do not exhibit this property. Therefore the use of such edge-triggered flip-flop in embedded logic subject to scan-set test techniques has priorly been generally proscribed.

A prior art circuit for a scan-set testable (embedded) edge-triggered flip-flop is shown and described as "LATCH CIRCUIT OPERATIONAL AS A D-TYPE EDGE-TRIGGER" in the IBM Technical Disclosure Bulletin Volume 22, number 12 for May, 1980 at pages 5261 and 5262. This "latch circuit operational as a D-type edge-trigger" shows, when compared with a nonscan-set-testable edge-triggered D-type flip-flop industry standard part number 74, that the incorporation of scan-set test capability required the addition of several NAND gates to the basic circuit. Despite the added NAND gates, a limitation to the scan-set testability of the prior art "latch circuit operational as a D-type edge-trigger" exists because of the inability to observe the correct function of some of the gates within the circuit being scan-set tested. Furthermore, a second limitation is that system data can only be observed after the "latch circuit operational is a D-type edge-trigger" has been reset by the scan-in operation. Thusly, this prior art edge-triggered flip-flop structure is not fully and completely scan-set testable, but merely shows a partial accommodation to the incorporation of scan-set test techniques into edge-triggered flip-flop digital logic structure.

SUMMARY OF THE INVENTION

The present invention is a fully scan-set testable embedded edge-triggered flip-flop. Such full scan-set testability is obtained at some additional cost in the amount of digital logics required. For example, 12 gates are utilized within the preferred embodiment fully scan-set testable (embedded) edge-triggered dual D-type flip-flop whereas the prior art structure utilizes only 10 gates. As a second example, the preferred embodiment fully scan-set testable (embedded) edge-triggered J-$\overline{K}$ flip-flop utilizes almost twice as many logic gates as an edge-triggered J-$\overline{K}$ flip-flop which is not scan-set testable. The full scan-set testability accorded by the circuit of the present invention does, however, permit of the embedded corporation of edge-triggered flip-flop logical elements into logic structures without the utilization of special design techniques to ensure verification and testability. Thusly, the circuits and methodology of the present invention permit of the full and complete scan-set test of the edge-triggered flip-flop logical element when such is embedded within a larger logical structure, which capability may be of paramount importance to logical structures with high requirements for testability and functional verification.

As well as the additional logic structure, two scan-set test enabling signals, as well as a conventional two-phase scan-set clock signal, are utilized to control the conduct of tests on the circuit apparatus of the present invention. When both of the test enablement signals are inactive, the circuit of the present invention effectively performs as the edge-triggered dual D-type or J-$\overline{K}$ flip-flop contained therein. The active states of one(s) of the two scan-set test enabling signals select and enable the conduct of three tests, only one of which is suggested by the prior art. During a first test mode, which mode is suggested by the prior art, certain of the input NAND gates (of the edge-triggered flip-flop) receiving systems data are checked in combination with the scan-set data input to such edge-triggered flip-flop. This first scan-set test alone is not enough to obtain total testing of the edge-triggered flip-flop. For example, a basic edge-triggered dual D flip-flop comprises six NAND gates, but only four of these NAND gates are tested by this first scan-set test (as suggested by the prior art).

The remaining two tests, selected by the appropriate condition of the two scan-set test enabling signals, test the remaining NAND gate logical elements of the edge-triggered flip-flops. The characteristic of the conduct of these two additional tests, on both the dual D-type and upon the J-$\overline{\text{K}}$ edge-triggered flip-flop logical structures, is that an inverter string of a succession of NAND gates is created, some of such NAND gates being the remaining, previously untested, parts of the edge-triggered flip-flop structure. The inverter strings receive the scan-set test data input, and the data outputs of such strings are merged into scan-set data outputs in order that the correct logical performance of such strings under, and during, test may be evaluated in a like manner to that scan-set first test performed. As an example of the additional inclusiveness obtained by the second scan-set test (such as creates an inverter string for validation of remaining NAND gates), the second test of the dual D-type edge-triggered flip-flop allows verification of those two NAND gates not exercised in either test one nor in the structure of the prior art.

As a further characteristic of scan-set verification testing through the interconnection of NAND logical elements of an edge-triggered flip-flop as inverter strings, the present invention teaches not only the functional logical validation of the gates within such an inverter string, but also the evaluation of the propagation time upon such strings in order to determine the combined operational speeds (as affected by the impedance environment) of all gates within the string. The propagation delay upon the inverter string under test is measured and/or compared, and the result thereof such measurement and/or comparison are an indication of whether NAND gate logical elements within the string have either marginal current recovery with time and/or are driving a low impedance load, both which conditions may be indicative of marginal circuit performance during actual functional use. Although the propagation delays upon inverter strings, such as the inverter strings characteristically created and exercised during the second and third scan-set test of the present invention, can always be measured, the measurement of the cumulative propagation delay of certain NAND gates part of the edge-triggered flip-flop structure is particularly important. These are the NAND gates, part of the edge-triggered flip-flop logic structure, which drive the system data to the next successive logical stages and elements. If these logical elements have low current drive capacity, and/or are overloaded by a low impedance environment, then the margin of correct functionality of edge-triggered logics may be small or insufficient. The present invention checks these important NAND gates. For example, in the scan-set testing of the dual D-type edge-triggered flip-flop, the third scan-set test creates the interconnection of NAND gates into an inverter string, the measurement and/or comparisons of the propagation delay(s) of which is particularly revelatory of the margins of correct functionality of the D-type edge-triggered flip-flop device within its utilized environment.

In summary, the circuit apparatus and method of the present invention teaches of the test control of an edge-triggered flip-flop in order that complete and total scan-set testability thereof may be obtained. Correspondingly, it is a first object of the present invention that complete testability of an embedded edge-triggered flip-flop should be obtained. It is a second object of the present invention that such complete testability should be obtained compatibly with, and via the scan-set test technique and interface. Specifically, this firstly means that when test vectors are generated for the combinatorial logic which feeds the system data input, then the edge-triggered flip-flop will be removed from the greater logical structure in which it is embedded and will serve only as a bistable virtual input/output flip-flop pin for the system logic structure. Specifically, this secondly means that if inverter strings are created as part of the testing, then the input to, the output from, and the clocking of, such inverter strings will be in all respects compatible with the scan-set test interface.

It is a third object of the present invention that the complete testability obtained, compatibly with and via the scan-set test technique, should have, as a general characteristic attribute, the effect that the edge-triggered flip-flop logical structures under test are, in the NAND gate elements thereof, interconnected as inverter strings. The creation of such inverter strings is demonstrated for both the dual D-type and J-$\overline{\text{K}}$ flip-flop logical elements, and by general extension, the technique of the present invention is applicable to all edge-triggered flip-flop logical structures. It is a fourth object of the present invention that the utilization of the inverter string created for functional logical test of the NAND gate logical elements of the edge-triggered flip-flop should also be evaluated to measure and/or compare the propagation time of signals thereon, which propagation time is indicative of the operational gate speed and/or the impedance environment of the NAND gates (part of the edge-triggered flip-flop) under test. The measurement and validation of such a propagation time thusly becomes an indication of the satisfactory current drive and/or impedance environment seen by NAND gates within the edge-triggered flip-flop. Such an evaluation is suitable for the detection of marginal conditions, as well as out right functional failures, within edge-triggered logics.

DESCRIPTION OF THE PREFERRED EMBODIMENT

Figure 1:
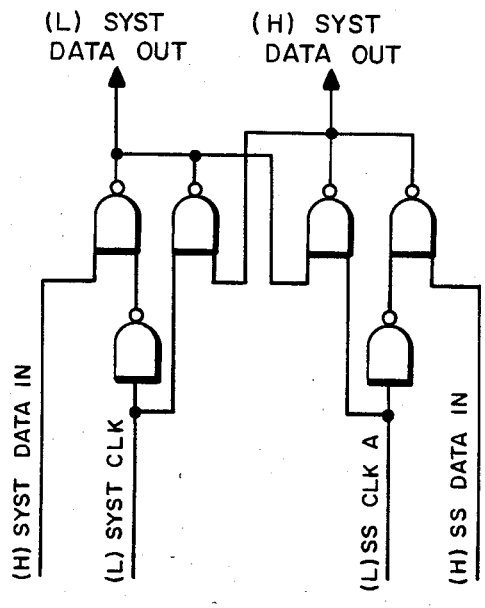
FIG. 1 shows a prior art bistable flip-flop.

A prior art bistable flip-flop is shown in FIG. 1. The signal output of such flip-flop, occurring as signals (H) SYST DATA OUT and (L) SYST DATA OUT, is always stable regardless of the time sequence between the input data as signal (H) SYST DATA IN and the system clock as signal (L) SYST CLK. Stability does not mean invariance, but rather means that the flip-flop will assume a set or cleared condition (dependent upon the data input) upon the coincidence of the system clock and the data input regardless of which occurs first in time. Such a property makes the bistable flip-flop latch suitable for scan-set testability.

Figure 2:
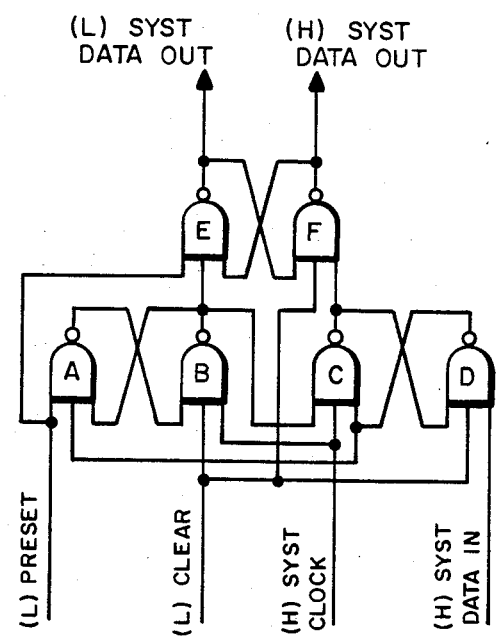
FIG. 2 shows a prior edge-triggered flip-flop type dual D-type positive edge-triggered flip-flop industry standard part number 74.

Conversely, the prior art edge-triggered flip-flop latch illustrated in FIG. 2 does not exhibit this characteristic. The edge-triggered flip-flop illustrated in FIG. 2 is the Dual D-type positive-edge-triggered flip-flop with preset and clear, industry standard part number 74. The function table for such a flip-flop is well-known, and appears in the *TTL DATA BOOK FOR DESIGN ENGINEERS*, Copyright Texas Instruments, Inc., 1976. The use of edge-triggered flip-flops in embedded logics subject to scan-set test techniques has priorly been generally proscribed.

Figure 3:
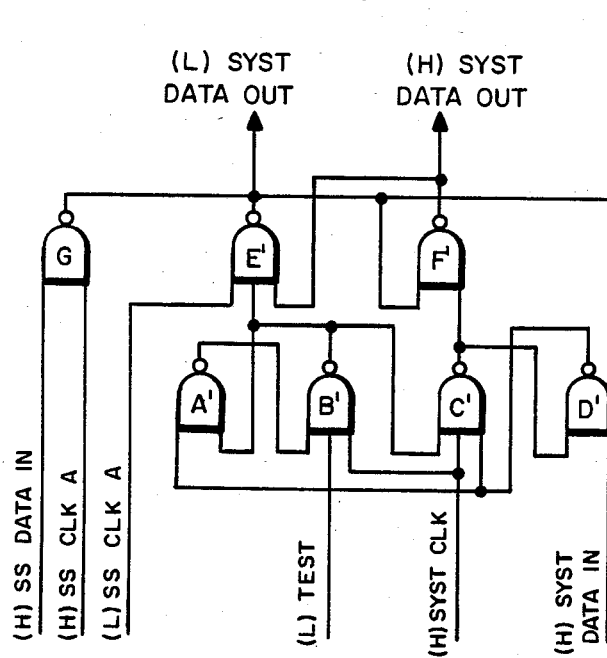
FIG. 3 shows a prior art edge-triggered flip-flop onto which limited scan-set testability has been incorporated.
Figure 3:
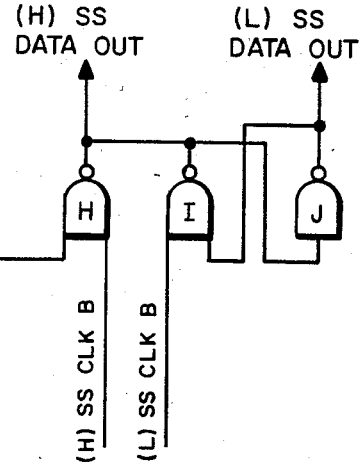

A prior art circuit for a scan-set testable (embedded) edge-triggered dual D-type flip-flop is shown in FIG. 3. This circuit appears in the IBM Technical Disclosure Bulletin article titled "Latch Circuit Operational as a D-type Edge Trigger" of Volume 22, No. 12 for May, 1980 at pages 5261 and 5262. The logical NAND gates A' through F' from which the edge-triggered flip-flop is built are so labeled in correspondence, although the type and number of received signals may not be identical, to NAND gates A through F for industry standard part number 74 as previously shown in FIG. 2. It is thusly illustrated that the scan-set test capability for the edge-triggered dual D-type flip-flop shown in FIG. 3 requires the addition of NAND gates G through J.

Scan-set test of the circuit of FIG. 3 may be performed by setting the flip-flop consisting of cross-coupled NAND gates E' and F' under the control of a Low signal output from NAND gate G. In order that this setting should be recognizable, it is first necessary that the flip-flop be cleared. This is accomplished in a normal manner for the operation of an edge-triggered flip-flop. That is, during the Low occurrence of signal (H) SYST CLK, NAND gate C' is disabled, producing a first High signal input to NAND gate D'. The High persistence of signal (H) SYST DATA IN satisfies NAND gate D', producing a Low signal input to NAND gates C' and A'. The resultant dissatisfaction of NAND gate A' produces a first High signal into NAND gate B'. During the High persistence of signal (L) TEST (testing not yet having been entered), the High occurrence of signal (H) SYST CLK will satisfy NAND gate B' producing a Low signal output received at NAND gates A', E' and C'. Such Low signal output will dissatisfy NAND gate E', producing High signal (L) SYST DATA OUT which is additionally received at NAND gate F'. In conjunction with the High signal resulting from dissatisfaction of NAND gate C', NAND gate F' is satisfied, thereby producing Low signal (H) SYST DATA OUT. Thereby the flip-flop consisting of cross-coupled NAND gate E' and F' has been cleared upon the High going occurrence of signal (H) SYST CLK.

Upon entering scan-set test for the prior art circuit shown in FIG. 3, signal (L) TEST becomes Low dissatisfying NAND gate B' and producing a first High signal into NAND gate E'. The High occurrence of signal (L) SS CLK A will be insufficient to satisfy NAND gate E' due to the persistence of Low signal (H) SYST DATA OUT. If, however, scan-set data is clocked in under the High occurrences of signal (H) SS DATA IN and (H) SS CLOCK A, then NAND gate G will be satisfied, thereby producing Low signal (L) SYST DATA OUT. This low signal will dissatisfy NAND gate F' producing High signal (H) SYST DATA OUT. This High signal (H) SYST DATA OUT will, in conjunction with the High signal from NAND gate B' and the now High signal (L) SS CLK A, satisfy NAND gate D' and set the latch consisting of cross-coupled NAND gates E' and F'. Such a logical one quantity set within this latch during the set portion of scan-set testing can be recovered into the latch consisting of cross-coupled NAND gates I and J upon the next sequential, B, clock cycle of scan-set shift testing. For example, the Low occurrence of signal (L) SYST DATA OUT will dissatisfy NAND gate H upon the High occurrence of signal (H) SS CLK B, producing High signal (H) SS DATA OUT and setting the flip-flop consisting of cross-coupled NAND gates I and J.

This prior art scan-set circuit for an edge-triggered dual D-type flip-flop shown in FIG. 3 has sufficed to check the correct operation of such a flip-flop comprised of cross-coupled NAND gates E' and F' only when such flip-flop was initially in a logical clear state. In order to consider this limitation, consider operation if signal (H) SYST DATA IN were low, dissatisfying NAND gate D'. The resultant High signal output from NAND gate D' is received at NAND gate C'. Before the system clock is High-going, meaning that signal (H) SYST CLOCK is Low, NAND gate B' will be dissatisfied producing a High output signal which is also received at NAND gate C'. When signal (H) SYST CLOCK goes High then NAND gate C' will be satisfied, producing a Low output signal which, as received at NAND gate F', will suffice to clear the flip-flop consisting of cross-coupled NAND gate E' and F'. This correct operational functionality of NAND gate C' is incapable of being tested by the scan-set technique as applied to the prior art circuit of FIG. 3. As an alternative way of looking at this testability limitation, it may be considered that the problem resides in the inability to move the output of NAND gate A' through NAND gate B' during the active, logically Low occurrence of signal (L) TEST.

Figure 4:
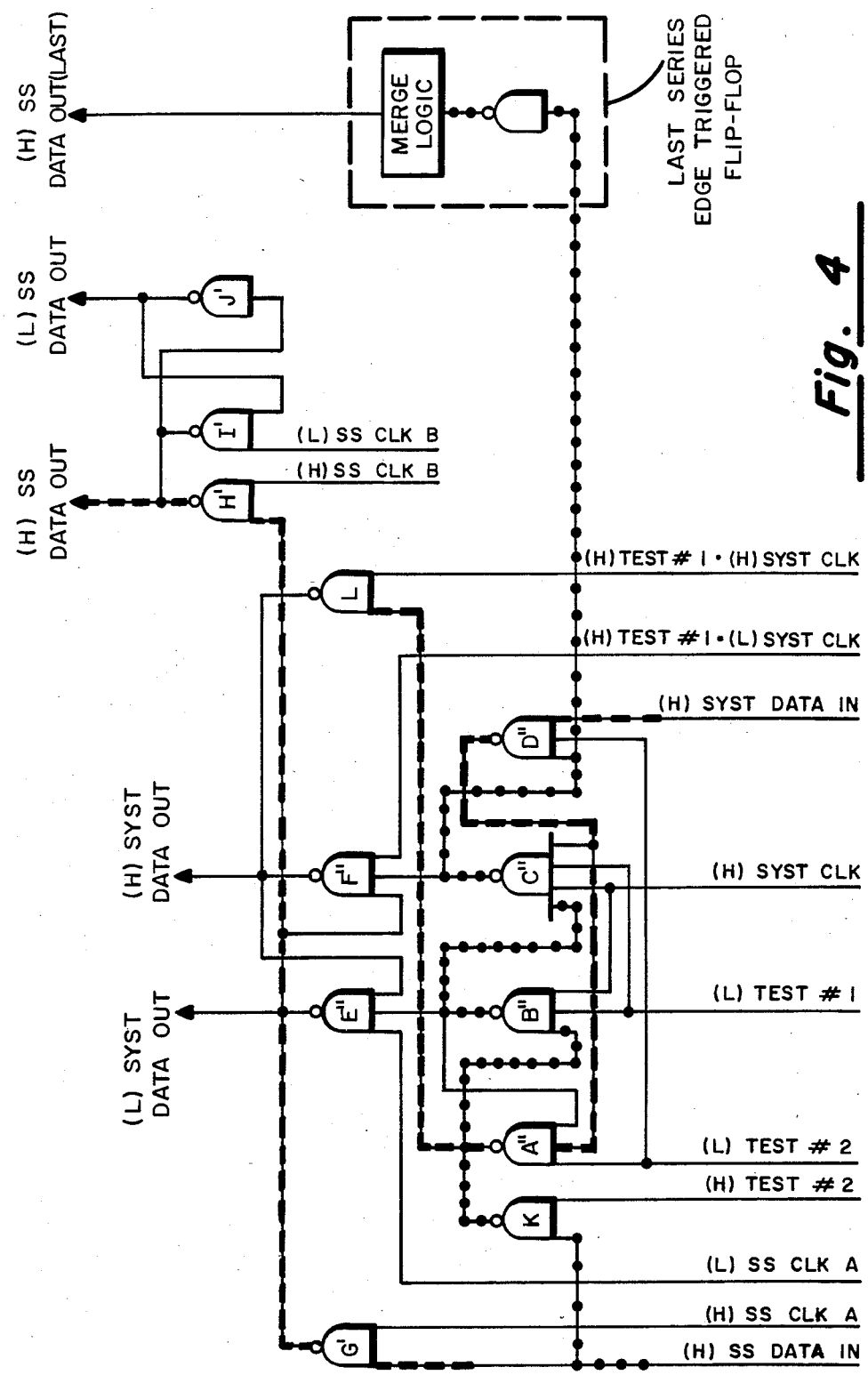
FIG. 4 shows the application of the method of the present invention to the edge-triggered dual D-type flip-flop industry standard part number 74, creating thereby a completely scan-set testable embedded edge-triggered flip-flop.

A fully scan-set testable embedded edge-triggered dual D-type flip-flop circuit apparatus incorporating the method of the present invention is shown in FIG. 4. The circuit shown is testable in three test modes, such modes as are established by the active or inactive condition of two test control, or test enablement, signals and two test clock signals. The first mode is established by the logical true, or active, condition of TEST #1 and the logical false, or inactive, condition of TEST #2. Under the Low, or true, condition of signal (L) Test#1, NAND gates B" and C" are disabled while under the Low, or false, condition of signal (H) TEST #2, NAND gate K is disabled. System data received as signal (H) SYST DATA IN is received through gates D", A", and L to set the flip-flop consisting of cross-coupled NAND gates E" and F". Such a first test mode path is indicated by a dashed line in FIG. 4. It may be observed that signal (H) SYST DATA IN is enabled to be gated through NAND gate D" under the High occurrence of signal (L) TEST #2 and the High signal resultant from disabled NAND gate C". Similarly, the signal resultant from NAND gate D" is enabled to be gated through NAND gate A" under the High condition of signal (L) TEST #2 and the High signal resultant from disabled NAND gate B". The signal output from NAND gate A", which signal is really signal (H) SYST DATA IN twice inverted, is gated through NAND gate L under the control of High signal (H) TEST #1. (H) SYST CLK. Such signal (H) TEST #1. (H) SYST CLK is simply the logical AND of the true conditions of TEST #1 and the system clock. If signal (H) SYST DATA IN is High, the resultant satisfaction of NAND gate L will produce Low signal (H) SYST DATA OUT and cause the clearing of the flip-flop consisting of cross-coupled NAND gates E" and F". If signal (H) SYST DATA IN is Low, the resultant dissatisfaction of NAND gate L and the High signal produced therefrom will, in conjunction with High signal (L) SS CLK A and that High signal resultant from disablement of NAND gate B", satisfy NAND gate E" will produce a Low signal (L) SYST DATA OUT and the setting of the flip-flop consisting of cross-coupled NAND gates E" and F".

Meanwhile, during the first test mode (TEST #1) the scan-set data input to the flip-flop consisting of cross-coupled NAND gates E" and F" is enabled through NAND gate G'. The High condition of signal (H) SS DATA IN, in conjunction with High signal (H) SS CLK A, will satisfy NAND gate G' resulting in Low signal (L) SYSTEM DATA OUT and the setting of the flip-flop consisting of cross-coupled NAND gates E" and F". If a scan-set data input is logically false, or zero, then the Low condition of signal (H) SS DATA IN will dissatisfy NAND gate G', producing a first High signal into NAND gate F". The High condition of signal (H) TEST 1. (L) SYST CLK, meaning that the system clock is not logically true while TEST #1 is still actively in progress, in conjunction with the High signal output from disabled NAND gate C", will satisfy NAND gate F" and result in Low signal (H) SYST DATA OUT and the clearing of the flip-flop comprised of NAND gates E" and F". Thus the flip-flop consisting of cross-coupled NAND gates E" and F" may be either set or cleared during the first test mode scan-set test operation, such setting or clearing as is combinatorial with the system data input proceeding through NAND gates D", A" and L. Upon the subsequent occurrence of the scan-set clock B, High signal (H) SS CLK B will gate the condition of the flip-flop comprised of cross-coupled NAND gates E" and F" (which condition is represented by signal (L) SYST DATA OUT) to cause the setting or clearing of that flip-flop consisting of cross-coupled NAND gates I' and J'. The scan-set test results are available as signals (H) SS DATA OUT and (L) SS DATA OUT resulting from this flip-flop.

In summary, the first mode test enabled when TEST #1 is active and TEST #2 is inactive allows the bistable flip-flop comprised of cross-coupled NAND gates E" and F" to be set or cleared combinatorially as established by systems data input proceeding through NAND gates D", A" and L and by scan-set data input proceeding through NAND gate G'. Such first test paths are, in portion, represented by dashed lines within the circuit diagram of FIG. 4 in order that they may be more clearly identified. The NAND gates D", A", L, G', E" and F", as well as the NAND gates H', I' and J', are checked during this first mode scan-set test operation. In particular, it should be noted that gates A" and D", as well as cross-coupled NAND gates E" and F", as were collectively part of the edge-triggered flip-flop are checked during this first test mode.

The second mode test of the scan-set testable embeddged edge-triggered dual D-type flip-flop circuit shown in FIG. 4 is enabled under the inactive condition of TEST #1, the active condition of TEST #2, the active condition the of system clock, and the inactive condition of both scan-set clock A and B. In such a case, NAND gates K, B" and C" will form an inverter string whereby signal (H) SS DATA IN may be ultimately, upon and within the last series edge-triggered flip-flop, merged by MERGE LOGIC within a LAST SERIES EDGE-TRIGGERED FLIP-FLOP into signal (H) SS DATA OUT (LAST), which signal is but the signal (H) SS DATA OUT for said LAST SERIES EDGE-TRIGGERED FLIP-FLOP. The complete gates as appear in the LAST SERIES EDGE-TRIGGERED FLIP-FLOP and in particular the series inverter string comprising NAND gates K, B" and C" within such LAST SERIES EDGE-TRIGGERED FLIP-FLOP, are not shown in FIG. 4 in order to reduce the complexity of the presentation of the essential circuit of the present invention. Neither is the detailed MERGE LOGIC within the LAST SERIES EDGE-TRIGGERED FLIP-FLOP shown. Such logic for merging that signal output from the end of that inverter string which originally began with signal (H) SS DATA I is not shown for being equivalent to that which will later be shown in FIG. 8, and for distracting from the essence of the present circuit as elsewheres shown in FIG. 4.

Continuing in FIG. 4 with a detailed, gate by gate, analysis of the data flow occurring during the second test mode signal (H) SS DATA IN is gated through NAND gate K under the High condition of signal (H) TEST #2. Similarly, the signal output of NAND gate K is gated through NAND gate B" under the High conditions of signals (L) TEST #1 and (H) SYST CLK. The Low condition of signal (L) TEST #2 disables both NAND GATES A" and D". The High signal so resultant from disablement of NAND gate D", in conjunction with High signals (L) TEST #1 and (H) SYST CLK, enables the gating of that signal resultant from NAND gate B" through NAND gate C". When the signal resultant from NAND gate C" is, upon the LAST SERIES EDGE-TRIGGERED FLIP-FLOP, merged into the signal (H) SS DATA OUT as resultant signal (H) SS DATA OUT (LAST), then the correct operability of the entire inverter string proceeding from signal (H) SS DATA IN may be verified.

Since such an inverter string may proceed across a numerous series of edge-triggered flip-flops, it may be useful to localize the site of an error upon the recognition of such error from the improper status of signal (H) SS DATA OUT (LAST) as developed and interpreted during this second mode test. Such a localization capability adds nothing to the comprehensiveness of the logical test of NAND gates K, B" and C" as is performed during this second mode test by observation of signal (H) SS DATA OUT (LAST) and is thusly useful but not essential to the utilization of that circuit of the present invention shown in FIG. 4. Additionally, such capability may be somewhat complex of implementation in the system test driver. However, if the flip-flop consisting of cross-coupled NAND gates E" and F" is initially cleared, either by normal system data input proceeding from signal (H) SYST DATA IN or by scan-set data input proceeding from signal (H) SS DATA IN prior to entering this second mode to test, it is possible to localize that point along an inverter string wherein gates K, B", or C" have failed. The set condition of the flip-flop consisting of cross-coupled NAND gates E" and F" produces High signal (H) SYST DATA OUT. During the second test mode persistence of the Low conditions of signal (H) TEST 1. (L) SYST CLK (which disables NAND gate F") and signal (H) Test 1. (H) SYST CLK (which disables NAND gate L), signal (H) SYST DATA OUT will remain High. The receipt of this signal (H) SYST DATA OUT plus the High signal (L) SS CLK A at NAND gate E" permits the gating in such NAND gate E" of the signal output from NAND gate B", and the potential enablement of this NAND gate E". If signal (H) SS DATA IN is High, then the signal from NAND gate B" will be High enabling NAND gate E" and producing Low signal (L) SYST DATA OUT. This was, of course, the previously set stage of the flip-flop and represents no error. If, however, the signal output from NAND gate B" had been Low in error, then the disablement of NAND gate E" would develop High signal (L) SYST DATA OUT. Since NAND gate G" is disabled under the Low condition of signal (H) SS CLK A, this High signal (L) SYST DATA OUT could be gated into the flip-flop consisting of cross-coupled NAND gates I' and J' under the High occurrence of signal (H) SS CLK B, such signal as gates NAND gate H'. At this time, TEST #2 would be rendered inactive, and the status of the flip-flop consisting of cross-coupled NAND gate I' and J' would be recovered via the normal scan-set test mechanism. The correct signal output as occurs from NAND gate B" within each of a successive series of edge-triggered flip-flops may be recovered via the scanset data collection mechanism. Employment of this isolation procedure, requiring as it does the sequential timed enablement of certain control signals, is not essential to the recognition of error within the NAND gates K, B", and C" as are checked in an inverter string during the second test mode operation.

Continuing in FIG. 4, the third and final test mode operation is enabled when TEST #1 is active and TEST #2 is inactive (as was the case for the first test mode) while both scan-set clock A and scan-set clock B are also simultaneously active. The simultaneously active condition of both scan-set clock A and Scan-set clock B connects signal (H) SS DATA IN through an inverter string comprised of NAND gates G' and H' to signal (H) SS DATA OUT. This is because signal (H) SS CLK A enables NAND gate G' while signal (H) SS CLK enables NAND gate H'. By measurement of the delay time between the High going signal (H) SS DATA OUT to the time of High going signal (H) SS DATA IN, the gate speed of NAND gates G' and H' may be measured. The functional operational verification of these gates had previously transpired during the first operational test mode. But the quantitative measurement of the gate operational speed now possible within this third operational test mode is particularly useful for assessing the correct operational environment of an edge-triggered flip-flop. In particular the measured delay between logical High going spiral (H) SS DATA IN and (H) SS DATA OUT will be a function of the impedance load seen by the net carrying signal (L) SYST DATA OUT. During normal circuit operational utilization, this net is driven by the edge-triggered flip-flop in the element of NAND gate E". If loading and fan-out rules for signal (L) SYST DATA OUT have been violated, or an incipient low impedance on this net has occurred, it may be possible to discern this marginal condition this via the increased gate delay occuring through the inverter string comprised of NAND gate G' and H'. This third mode operational test, such as is not necessary for functional logical validation, provides an added dimension of assuring the correct operation of the edge-triggered flip-flop circuit, especially as embedded within a larger logic network.

In summary, the dual D-type edge-triggered flip-flop shown in FIG. 4 has been shown to be fully scan-set testable. Normally the second mode operational test is performed first, checking gates K, B" and C" in an inverter string. The remaining gates are checked during the first mode operational test. In particular, gates E" and F" as comprise a flip-flop are checked when the scan-set shift test is being utilized to shift scan-set data through the shift register comprised of this flip-flop and the accompanying flip-flop of gates I' and J'. Gates D' and A' (as well as L) are in the data path during the functional test and are additionally tested during the first mode operational test. The original edge-triggered dual D-type flip-flop comprised of NAND gates A" through F" is completely tested under the first and second mode operational tests.

When the test vectors, such as establish the condition of signal (H) SYST DATA IN, are being generated for the combinatorial logic which feeds the system data input, then the edge-triggered dual D-type flip-flop shown in FIG. 4 is removed from the greater logical structure in which it is embedded and serves only as a virtual input/output pin for that logical structure. This is the same technique as is used for the scan-set test of the bistable flip-flop as was shown in FIG. 1. In other words the circuit apparatus of the present invention can be considered to extract an edge-triggered flip-flop from the controlled time sequence between the system clock and the system data as is normally required by such, and to instead transform such into a bistable flip-flop structure which is susceptible to scan-set test.

The circuit apparatus of the present invention as a fully scan-set testable embedded edge-triggered dual D-type flip-flop as shown in FIG. 4 additionally offers the opportunity in a third mode operational test to validate the gate speed of gates G' and H' and, more importantly, to assess thereby the circuit impedance seen by gate G', which impedance is a normal operational impedance seen by such edge-triggered flip-flop. In edge-triggered logic the time and sequence of signal generation, such as signal (L) SYST DATA OUT, may be important to the correct operation of further subsequent logic stages. This third mode operational test helps verify that at least signal (L) SYST DATA OUT may be timely correctly generated, as well as to be correctly generated at all.

Figure 6:
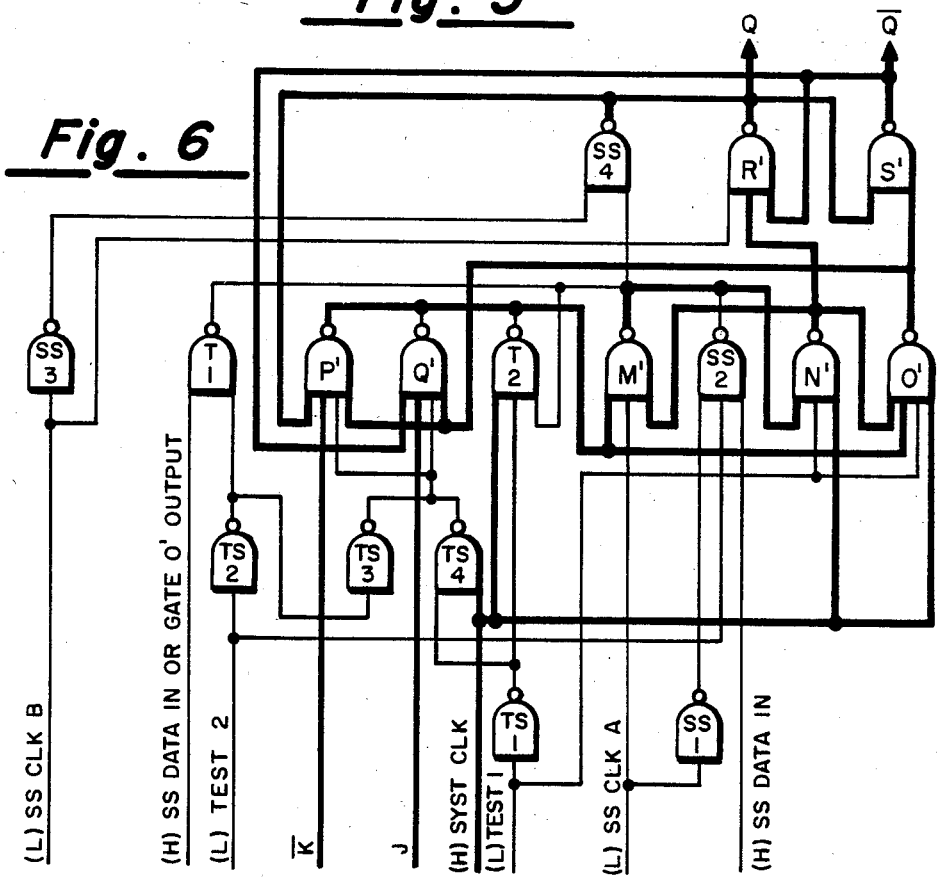
FIG. 6 shows a first variant of the application of the method of the present invention to the edge-triggered J-$\overline{\text{K}}$ flip-flop, creating thereby a completely scan-set testable embedded edge-triggered J-$\overline{\text{K}}$ flip-flop incorporated into one pair of functional/slave latches.
Figure 9:
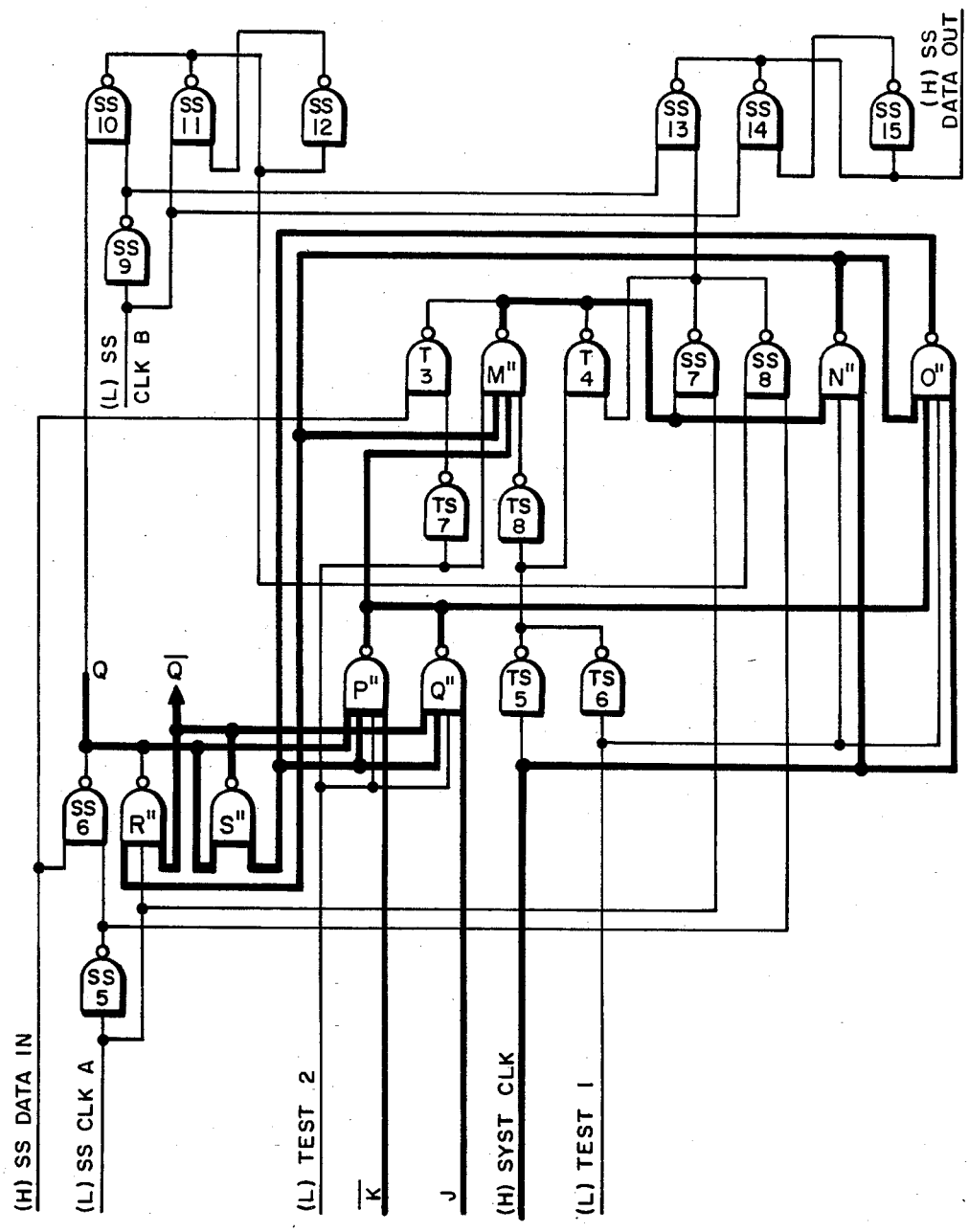
FIG. 9 shows a second variant of the application of the method of the present invention to an edge-triggered J-$\overline{K}$ flip-flop in order to produce thereby a completely scan-set testable embedded edge-triggered J-$\overline{K}$ flip-flop incorporated into an adjacent pair of functional latches.

If the present invention is considered only in the form of the circuit apparatus of a fuly scan-set testable embedded edge-triggered dual D-type flip-flop shown in FIG. 4, the essential method and apparatus of the present invention may be difficult to discern. The present invention is a method and apparatus for enabling full scan-set testability of edge-triggered flip-flops. In order to do so, two scan-set test enablements, allowing the selection of additional, more comprehensive, testing are applied to the circuit structures of the present invention. But the primary characteristic of the expanded scan-set testing enabled is that the circuit structure under test is assembled, in certain of the elements thereof, into an inverter string, which inverter string is both supplied with input scan-set test data and does (ultimately) deliver data out as scan-set test data output in order that the correct logical functionality of the elements therein such inverter string may be assessed. Furthermore, it is a characteristic of such inverter string that, once selectively created, they may be subject to time delay measurements in order that the signal drive capacity and/or impedance environment of the elements therein said inverter string may be (collectively) evaluated. In order that the essential method and apparatus of the present invention may be further observed, two further variants of the present invention as a completely scan-set testable embedded edge-triggered J-$\overline{\text{K}}$ flip-flop are shown in FIG. 6 and FIG. 9. Although these logical structures are obviously different from both that the completely scan-set testable embedded edge-triggered dual D-type flip-flop shown in FIG. 4, and from each other, it is trusted that the explanation of the operative characteristics of the present invention as implemented in the logical structures shown in FIG. 6 and FIG. 9 will allow of the recognition that the present invention is a generalized scheme applicable to multiple types of embedded edge-triggered flip-flops, which scheme may be alternatively differentially implemented even upon the same type of edge-triggered flip-flop (such as a J-$\overline{\text{K}}$ flip-flop).

Figure 5:
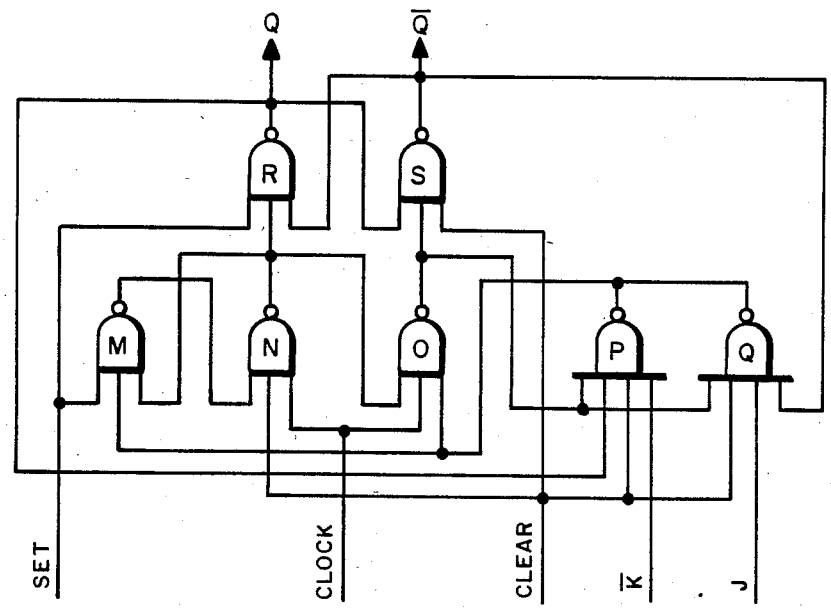
FIG. 5 shows a prior art type J-$\overline{\text{K}}$ positive edge-triggered flip-flop industry standard part number 109.

For comparison purposes with the two variants of the present invention as a fully scan-set testable embedded edge-triggered J-$\overline{\text{K}}$ flip-flop shown in FIG. 6 and FIG. 9, FIG. 5 shows the basic prior art circuit of an edge-triggered J-$\overline{\text{K}}$ flip-flop industry standard part number 109. The NAND gate logical elements of such J-$\overline{\text{K}}$ flip-flop are labeled M through S, and have a combinatorial interconnect and function as an edge-triggered flip-flop which is well-known in the art. This edge-triggered J-$\overline{\text{K}}$ flip-flop logic structure exhibits two major problems to testability when embedded into a larger logic structure. First, being edge-triggered it is not race free and is dependent upon the sequence of pulses applied to the CLOCK and J inputs in conjunction with $\overline{\text{K}}$ inputs for the determination of the Q (and $\overline{\text{Q}}$) outputs. Second, as may be observed in the signal path proceeding from the Q and $\overline{\text{Q}}$ outputs, there exists an internal feedback path which makes the final output levels dependent upon the output state before the occurrence of the signal CLOCK as gates the J and $\overline{\text{K}}$ input signal levels. Similarly to the edge-triggered dual D-type flip-flop shown in FIG. 2, these conditions render the edge-triggered J-$\overline{\text{K}}$ flip-flop unsuitable for scan-set test when embedded within a larger logic structure.

The first variant circuit resultant from the application of the method of the present invention to the edge-triggered J-$\overline{\text{K}}$ flip-flop shown in FIG. 5 is shown in FIG. 6. The circuit of FIG. 6 is a completely scan-set testable embedded edge-triggered J-$\overline{\text{K}}$ flip-flop. The logical NAND gates M' through S' are labeled in correspondence (although the type and number of received signals may not be identical) to NAND gates M through S of the prior art industry standard part number 109 shown in FIG. 5 in order that the essential equivalent function of these NAND gates may be recognized. NAND gates labeled SS1 through SS4 are incorporated exclusively for the accomplishment of first mode, prior art suggested, scan-set testing. Gates labeled T1 and T2, on the other hand, are involved exclusively with those further mode tests (characteristically creating inverter strings) by which the total scan-set testability of the present circuit is realized. Finally, gates labeled TS1 through TS4 are involved with multiple tests, and interact with multiple of the embedded logic elements.

Continuing in FIG. 6 with the explanation of the fully scan-set testable edge-triggered J-$\overline{\text{K}}$ flip-flop shown therein, when signal (L) TEST 1 and (L) TEST 2 are inactive, or High, then the logic structure functions identically to industry standard part number 109 shown in FIG. 5. NAND gate M' through S' shown in FIG. 6 correspond to this J-$\overline{\text{K}}$ flip-flop structure, and the interconnect therebetween is shown in heavy lines in FIG. 6 in order that the equivalent interconnection, and functionality, of such gates may be more clearly assessed.

Figure 7:
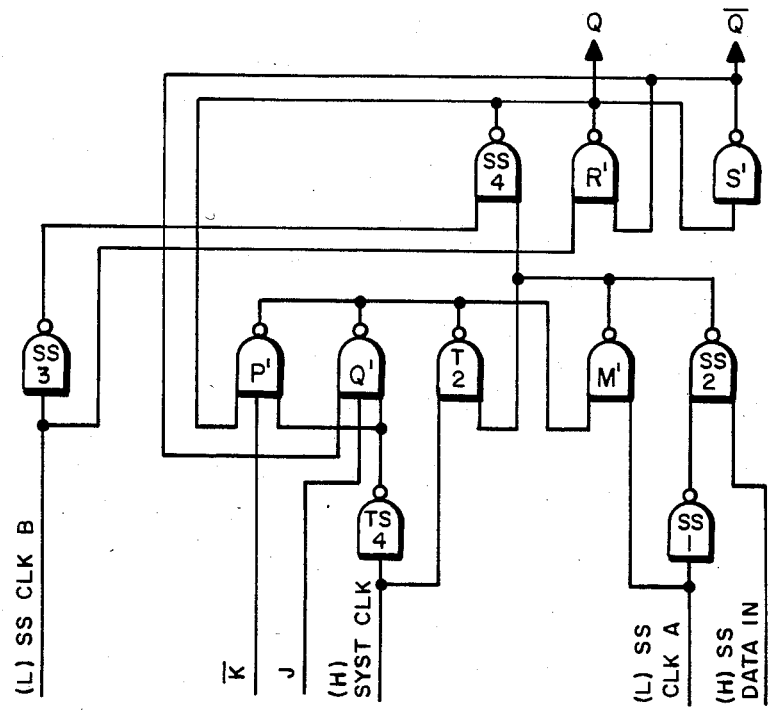
FIG. 7 shows an extraction of certain of those logical elements previously shown in FIG. 6 in order that the operation of the circuit may be more clearly observed for the conduct of a first mode scan-set test thereupon.

Continuing in FIG. 6, the first mode scan-set test is enabled when signal (L) TEST 1 is active, or Low, while signal (L) TEST 2 is inactive, or High. In order to simplify the explanation of the circuit shown in FIG. 6 during this first and the next second, scan-set test mode, the effective active logic structure of FIG. 6 during the active condition of signal (L) TEST 1 and the inactive condition of signal (L) TEST 2 is shown in FIG. 7. The NAND gates of FIG. 6 which are inactivated, or disabled during this first mode scan-set test are not shown in FIG. 7 for simplification. During scan-set test first mode, gates M', R' and S' are verified during the shift test of the scan-set register.

Referencing FIG. 7, the Low condition of signal (L) SS CLK A will dissatisfy NAND gate M' providing an initially High first signal input into NAND gate SS4. The Low condition of signal (L) SS CLK B as inverted in inverter SS3 provides a second High signal input to NAND gate SS4, producing a Low signal output therefrom which clears the flip-flop comprised of cross-coupled NAND gates R' and S'. Cleared means that signal output Q is Low while signal $\overline{\text{Q}}$ is High. When scan-set clock A goes to the true condition, then signal (L) SS CLK A becomes Low, and as inverted in inverter SS1 enables the gating of signal (H) SS DATA IN in NAND gate SS2. If such signal (H) SS DATA IN is High, representing a scan-set data bit equalling one, then the signal output of NAND gate SS2 will be Low. This Low signal dissatisfies NAND gate SS4 while upon the next occurrence of scan-set clock B, the Low condition of signal (L) SS CLK B will likewise dissatisfy NAND gate R'. With both NAND gates SS4 and R' dissatisfied, the High signal output therefrom will set the flip-flop consisting of cross-coupled NAND gates R' and S', producing Low signal Q and High signal $\overline{\text{Q}}$ outputs.

During the second scan-set test mode, signal (L) TEST 1 remains active, or Low, while signal (L) TEST 2 remains inactive, or High. Thusly those logic gates of FIG. 6 which are active remain those which are abstracted and shown in FIG. 7. During the second scan-set test mode, however, the system clock is active resulting in High and Low going signal (H) SYST CLK. This second scan-set test mode thusly allows the testing of NAND gates P' and Q' in addition to NAND gates M', R' and S'. Momentarily referring to FIG. 6, NAND gate N' and O' are held inactive, or dissatisfied, during the occurrence of signal (H) SYST CLK by the receipt of Low signal (L) TEST 1 thereat. Therefore, returning to FIG. 7, cross-coupled NAND gates R' and S' as comprise a flip-flop may be set with the scan input data ANDed with the J and $\overline{K}$ signal inputs. The manner by which this occurs is as follows. The Low condition of signal (H) SYST CLK as inverted in inverter TS4 suffices as a first High signal in satisfaction of NAND gates P' and Q'. Dependent upon whether the flip-flop consisting of cross-coupled NAND gates R' and S' is set (signal Q is High) or cleared (signal Q is Low), either NAND gate P' will be enabled for gating signal ', or else NAND gate Q' will be enabled for gating signal input J. If the gated system data input is signal $\overline{K}$ which is false, or High, then a Low signal output will result from NAND gate P'. If the gated system data input is signal J which is true, or High, the signal output of gate Q' will be Low. Either such Low signal output from gate P' or Q' will dissatisfy NAND gate M', producing a High signal output therefrom which is received at NAND gate T2. Upon the logical High occurrence of signal (H) SYST CLK, the flip-flop comprised of cross-coupled NAND gate T2 and M' will assume the state wherein the signal output of NAND gate M' is High, originally resultant from a system data input $\overline{K}$ which was false or a system data input J which was true. Upon the Low occurrence of signal (L) SS CLK A which, as inverted in inverter SS1 satisfies NAND gate SS2 to gate signal (H) SS DATA IN, the wire-ORed signal output of NAND gate M' and SS2 will effectively establish that the scan input data represented by signal (H) SS DATA IN is ANDed with the system data J and $\overline{K}$ inputs. This signal output from NAND gates M' and SS2 is gated through NAND gate SS4 upon the Low occurrence of signal (L) SS CLK B to gate the flip-flop consisting of cross-coupled NAND gates R' and S' in the manner previously described. By momentary reference to FIG. 5 and FIG. 6 it may be noted that scan-set testing as effected during the first scan-set test mode and the second scan-set test mode to this point has not tested the entirety of the edge-triggered J-$\overline{K}$ flip-flop, with two of the NAND gates thereof remaining to be tested.

Figure 8:
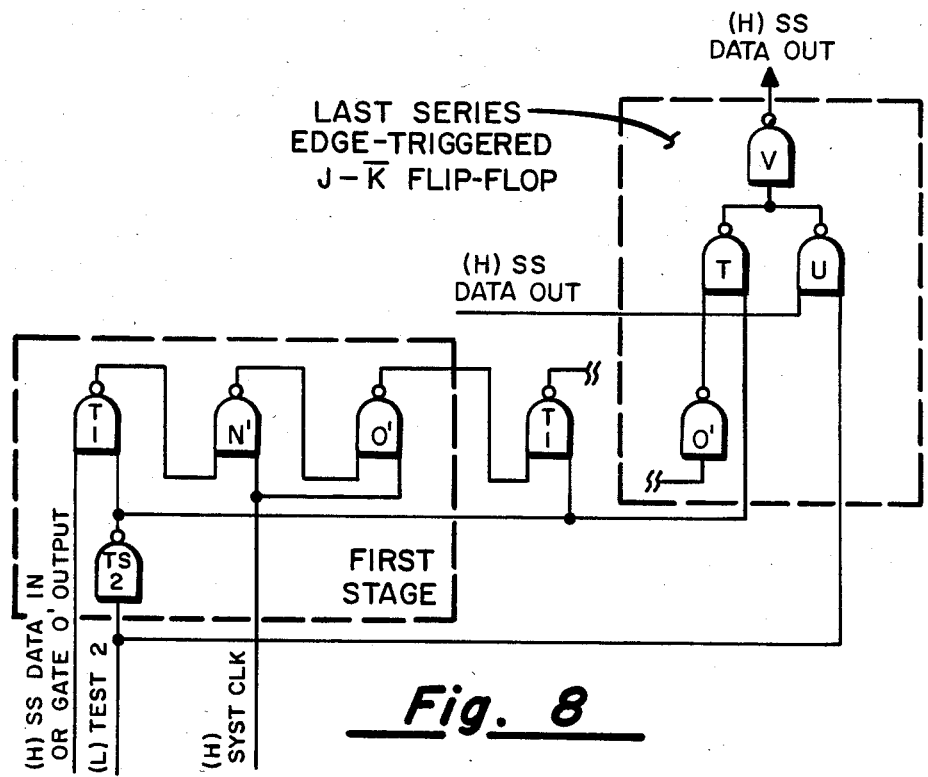
FIG. 8 shows an extraction of certain logical elements (gates) of the fully scan-set testable J-$\overline{\text{K}}$ flip-flop shown in FIG. 6 in order that the utilization thereof during the conduct of a second mode scan-set test may be more clearly observed.

The third scan-set test, within which the final two NAND gates N' and O' are tested, is enabled on the logic structure of FIG. 6 when signal (L) TEST 2 is active or Low, signal (L) TEST 1 is inactive or High, signal (H) SYST CLK is active (High and Low going) while the scan-set clocks, signals (L) SS CLK A and signal (L) SS CLK B are inactive, or High. Similarly to the manner in which the active logic structure of the circuit of FIG. 6 during the exercise of the first two scan-set tests was extracted and shown in FIG. 7, FIG. 8 shows the active logic elements of the circuit of FIG. 6 during the exercise of the third scan-set test. The third test is designated is a scan-set type test because the test as enabled between the scan-set data input and the scan-set data output.

Referring to FIG. 8, the inverter string path between the scan-set data input and the scan-set data output which allows of the testability of final NAND gate elements of the edge-triggered J-$\overline{K}$ flip-flop (thereby supporting total testability of such flip-flop), and which inverter string is the characteristic of the full-testability of edge-triggered flip-flop exercised by the method of the present invention, is immediately visible.

During the third and final scan-set test of the edge-triggered J-$\overline{K}$ flipflop signal (L) Test 1 is inactive of High, signal (L) TEST 2 is active or Low, the system clock is active giving High and Low going signal (H) SYST CLK, and the scan-set clocks are inactive making signals (L) SS CLK A and (L) SS CLK B High. Momentarily referring to FIG. 6, the active logic elements upon the occurrence of these signal conditions may be seen to logically reduce to the simplified structure shown in FIG. 8. Referencing FIG. 8, signal (H) SS DATA IN OR GATE O' OUTPUT will be the scan-set data input signal to a plurality of stages each consisting of the inverter string comprised of NAND gates T1, N' and O'. For stages after the first such stage, this signal (H) SS DATA IN OR GATE O' OUTPUT will be the signal derived from NAND gate O' of the previous stage, such as is illustrated in the interconnection from NAND gate O' of the FIRST STAGE to the gate T1 (second occurrence) of the next, subsequent, stage. Within each stage, the active, or Low, occurrence of (L) TEST 2 is inverted in inverter TS2 and applied to NAND gate T1 to gate the data input signal. The signal output of NAND gate T1 is coupled to NAND gate N' and then to NAND gate O' as an inverter string. After threading a succession of such stages which is indicated by the broken line in FIG. 8, the signal of the inverter string enters the LAST SERIES EDGE-TRIGGERED J-$\overline{K}$ FLIP-FLOP stage. Within this stage the signal from the inverter string is merged into the signal (H) SS DATA OUT, which signal is the normal scan-set data output signal utilized by the logic device controlling the scan-set testing in the assessment of the valid functional operation of the circuit, herein the edge-triggered J-$\overline{K}$ flip-flop, under test. After threading the last NAND gate, NAND gate O', of the inverter string within the LAST SERIES EDGE-TRIGGERED J-$\overline{K}$ FLIP-FLOP, the signal therefrom is gated through NAND gate T under the logical High signal developed from the inversion of Low signal (L) TEST 2 in logic element TS2 (which logic element may be within the FIRST STAGE, within the LAST SERIES EDGE-TRIGGERED J-$\overline{K}$ FLIP-FLOP, or within any stage). NAND gate T, U, and V are particular additional NAND gates associated with the LAST SERIES EDGE-TRIGGERED J-$\overline{K}$ FLIP-FLOP in order to accomplish the merge function of the signal resultant from the inverter string into signal (H) SS DATA OUT. In order to do so, signal (H) SS DATA OUT (first occurrence) from any scan-settable logic is gated in NAND gate U by the High occurrence of signal (L) TEST 2, such as occurs only when the third scan-set test is not active. For example, if this merge circuitry within the LAST SERIES EDGE-TRIGGERED J-$\overline{K}$ FLIP-FLOP was being used in the conduct of the first scan-set test mode or the second scan-set test mode, then signal (H) SS DATA OUT would arise as the Q signal output of the flip-flop consisting of cross-coupled NAND gates R' and S' (reference FIG. 6 and FIG. 7). In the exercise of the third scan-set test mode it is the signal output of NAND gate T which is further inverted in inverter V and transmitted as signal (H) SS DATA OUT to the logic device controlling scan-set test in indication of the correct function of all elements of the inverter string proceeding from initial signal (H) SS DATA IN. These merge logics such as allow the output signal from an inverter string to be merged into the scan-set data output signal are equivalent to those which would be used for an edge-triggered dual D-type flip-flop, and which are represented by the MERGE LOGIC shown in FIG. 4.

By comparison of the dotted line path for test of an edge-triggered dual D-type flip-flop shown in FIG. 4, and the comparable path through an inverter string for the test of an edge-triggered J-$\overline{\text{K}}$ flip-flop shown in FIG. 8, the essence of the present invention may be perceived. It must be recalled that these test paths, compatibly integrated into the scan-set test regimen additionally performed by transforming the edge-triggered flip-flop structures into bistable flip-flops for the purpose of test, does enable the testing of certain NAND gate logical elements thereof such edge-triggered flip-flops which, when tested, do allow of the totality of the test of such edge-triggered flip-flops. Furthermore, the creation of an inverter string in support of scan-set compatible test does allow of the measurement of time delays in the signal propagation through such inverter string, which time delay measurement is revelatory of the current drive capacity and the impedance environment of the NAND gate logical elements within such inverter strings under test. Such an assessment of propagation delay, as may be manually done with such test tools as an oscilloscope or may be automatedly performed, is useful in assessing marginal conditions which may affect valid circuits operation as edge-triggered logics.

As a final illustration of the present invention, an illustration, which shows that any edge-triggered flip-flop circuit needs be studied with some diligence in order to discern the operation of the present invention, a second variant of the application of the apparatus and method of the present invention to an edge-triggered J-$\overline{\text{K}}$ flip-flop is shown in FIG. 9. As was the case with FIG. 6, NAND gates M" through S" are labeled in correspondence with the associated NAND gate M through S of the edge-triggered J-$\overline{\text{K}}$ flip-flop shown in FIG. 5. As before, that interconnection which represents the normal, non-test operation of the present circuit as an edge-triggered J-$\overline{\text{K}}$ flip-flop is shown in heavy line. Similarly to the nomenclature of FIG. 6, NAND gates SS5 through SS15 are involved in the exercise of the circuit during a first mode scan-set test. NAND gates labeled T3 and T4 are utilized in enabling the interconnection of an inverter string by which the third mode scan-set test may be performed. Finally, NAND gates labeled TS5 through TS8 are involved in more than one scan-set test mode. The exercise of scan-set test modes one and two on the fully scan-set testable embedded edge-triggered J-$\overline{\text{K}}$ flip-flop circuit variant shown in FIG. 9 is identical to those modes as respectively illustrated in FIG. 7 and FIG. 8. In other words, control of the two scan-set test enablement signals (L) TEST 1 and (L) TEST 2, the scan-set clock signals (L) SS CLK A and (L) SS CLK B, and the scan-set data inputs (H) SS DATA IN plus the system data input $\overline{\text{K}}$ and J is equivalent to the control of such signals as illustrated in FIG. 7 and FIG. 8 for the circuit variant of FIG. 6. Diligent study of the effect of the application of appropriate signals upon each scan-set test mode will first reveal that the J-$\overline{\text{K}}$ flip-flop logic structure shown in FIG. 9 is embedded into a scan-set shift register comprised of two flip-flops, similarly to FIG. 7. Within FIG. 9, gates R" and S" are part of the first flip-flop and gate M" is part of the second flip-flop which enables scan-set test as a shift register. In this first test mode configuration (similar to the configuration shown in FIG. 7) gates P" and Q" are part of the logical input to this second flip-flop (containing N" and M"). The pertinent active circuit elements during the conduct of the first scan-set test mode may be traced in a manner similar to the derivation of FIG. 7 from FIG. 6. Furthermore, and similarly, the conduct of the second scan-set test mode 3 upon the circuit structure shown in FIG. 9 will allow the final verification of NAND gates N" and O" as an inverter string, similarly to the verification during such second mode test upon the structure of FIG. 6 as was shown in FIG. 8.

Therefore, it is a first summary characteristic of the present invention that NAND gate circuit elements of an embedded edge-triggered flip-flop may be tested by a scan-set shift register data transfer procedure by transforming, under control signals, such NAND gate circuit elements into a bistable flip-flop logic structure. All the original NAND gate logic elements of the original embedded edge-triggered flip-flop structure are not completely tested during such a first scan-set test. It is a further charcteristic of the present invention that a method and apparatus is shown by which the remaining NAND gate logical elements of the original embedded edge-triggered flip-flop may be tested. This test is via the interconnection of such remaining NAND gate logic elements into an inverter string, the input into which such string and the output from which such string are coupled into the normal scan-set data transfer paths. It is also possible for such an inverter string, exercisable and observable for logical malfunction during the normal administration of scan-set testing, to be additionally observed for the occurrence of excessive delay in the propagation of signals thereupon such excessive delay as may be indicative of inadequate current drive capacity and/or an unsatisfactorily low impedance environment for one(s) of the NAND gate elements within such inverter string. Since these NAND gate elements experiencing inadequate current drive and/or unsatisfactory impedance are part of the original embedded edge-triggered flip-flop, then such an observation of excessive delay may be indicative of marginal circuit conditions and/or environment such as may preclude the reliable function of edge-triggered logics.

There have been shown three embedded edge-triggered flip-flop logical structures, one of the dual D-type and two of the J-$\overline{\text{K}}$ type, which are fully scan-set testable. It is to be understood, however, that various changes, modification and substitutions in the nature of the detail of the described circuits could be made by those skilled in the art after recognition of the basic essence of the present invention in transforming an edge-triggered flip-flop structure into (first) a bistable flip-flop, and (second) into an inverter string for the purposes of conducting plural scan-set tests. The scope of the invention is defined by the following claims.

What is claimed is:

1. An extended and expanded improved testing method to that scan-set testing of an edge-triggered flip-flop which, by the interconnection of some of the NAND gate logic elements thereof said flip-flop, does exercise said elements as a race-free bistable flip-flop during scan-set testing responsively to an active scan-set first test enablement signal, called TEST 1, plus active test clock signals, called SS CLK A and SS CLK B, to shift the scan-set test data signal input, called SS DATA IN, to a scan-set test data signal output, called SS DATA OUT, said improved testing method, to the end that remaining ones of the NAND gate logic elements of said edge-triggered flip-flop should also be tested, comprising:

identifying those serially interconnected first NAND gates of the edge-triggered flip-flop logic structure which were disabled, and were therefore untestable, by said active condition of said first test enablement signal, said signal TEST 1, during said scan set-testing;

causing said first test enablement signal, said signal TEST 1, to assume the inactive condition in partial enablement of those said serially interconnected first NAND gates which had been previously disabled during said scan-set testing;

identifying those second NAND gates which are cross-coupled with any one or ones of said serially interconnected first NAND gates, said cross-coupling meaning that when said second NAND gates are operative then the active signal outputs therefrom will be received at the signal inputs to any one or ones of said serially interconnected first NAND gates;

applying the active condition of a second test enablement signal, called TEST 2, in order to disable said second NAND gates;

gating in a third NAND gate the active scan-set test data signal input, said SS DATA IN, with said active second test enablement signal, said TEST 2, in order to produce a second-test stimuli signal;

applying said second-test stimuli signal in partial enablement of the first of said serially interconnected first NAND gates;

allowing an actively cycling system clock signal, called SYST CLK, received at said serially interconnected first NAND gates, to clock said second-test stimuli signal through both said serially interconnected first NAND gates;

merging said clocked second-test stimuli signal upon the output of the last of said serially interconnected first NAND gates into, and becoming as, said test data signal output, said SS DATA OUT;

whereby said serially interconnected first NAND gates which were disabled, and therefore untestable, during said scan-set testing are enabled and interconnected between said test data signal input, said SS DATA IN, and said test data signal output, said SS DATA OUT, during the active condition of said second test enablement signal, said TEST 2, and said actively cycling system clock signal, said SYST CLK;

whereby said serially interconnected first NAND gates are tested.

2. The extended and expanded improved testing method of claim 1 further comprising:

observing the signal propagation delay between said test data signal input, said SS DATA IN, and said test data signal output, said SS DATA OUT, as indicative of both the current drive capacity of said serially interconnected first NAND gates and the impedance experienced by said serially interconnected first NAND gates in the propagation of said test data signal input, said SS DATA IN;

wherein said observing of signal propagation delay is useful to assess, as by comparisons between like ones of edge-triggered flip-flops subject to test, whether there exists abnormally lengthy signal propagation times through said serially interconnected first NAND gates which precludes or may marginally preclude correct reliable operation of the edge-triggered flip-flop structure as embedded.

3. An improvement to the process of scan-set testing an edge-triggered flip-flop embedded in a scan-set shift register, said scan-set testing being in response to, and during, an active first test enablement signal (TEST 1) plus in response to, and during, the active condition of scan-set clock signals (SS CLK A and SS CLK B) in order to shift an input scan-set test data signal (SS DATA IN) to an output scan-set test data signal (SS DATA OUT); and said scan-set testing necessarily disabling, by and during said active condition of said first test enablement signal (TEST 1) both a first input NAND gate (B" or N') and serially interconnected second input NAND gate (C" or O') of said edge-triggered flip-flop which said first (B", or N') and said second (C", O') input NAND gates are identifiable for also uniquely receiving the system clock signal (SYST CLK) in order that, by said disabling by and during said active condition of said first test enablement signal (TEST 1) both said first (B", or N') and said second (C", or O') input NAND gates also receiving said active system clock signal (SYST CLK) will not be satisfied and will thusly not develop output signals which would conflict with said scan-set testing of said edge-triggered flip-flop, said improvement to the process of scan-set testing being to the purpose that said first (B", or N') plus said second (C", or O') input gates may be tested compatibly with, and at a time after, said scan-set teting responsively to said first test enablement signal (TEST 1), said improvement process comprising:

causing said first test enablement signal (TEST 1) to assume the inactive condition in partial enablement of said first input NAND gate (B", or N') and said serially interconnected second NAND gate (C", or O');

causing a separate second test enablement signal (TEST 2) to assume the active condition;

first applying said active second test enablement signal (TEST 2) to all those NAND gates of the edge-triggered flip-flop, other than said first NAND gate (B", or N ') and said NAND gate (C", or O'), which do receive signals from either said first NAND gate (B", or N') or from said second NAND gate (C", or O');

gating in a third NAND gate (K or T) said scan-set test data signal (SS DATA IN) with said active second test enablement signal (TEST 2) in order to produce a second-test stimuli signal;

gating said second-test stimuli through said first NAND gate (B", or N') and then, as the output signal of said first NAND gate, through said serially interconnected second NAND gate (C", or O') during the active condition of said system clock signal (SYST CLK);

merging in a plurality of fourth NAND gates the clock-signal-gated second-test stimuli signal derived at the output of said second NAND gate (C", or O') into, and becoming, said output test data signal (SS DATA OUT);

wherein a signal path has been created for said input scan-set test data signal (SS DATA IN) through said third NAND gate (K, or T) then through said first NAND gate (B", or N') then through said second NAND gate (C", or O') then through said plurality of fourth NAND gates which do said merging until said signal does become said test data output signal (SS DATA OUT);

wherein since said first NAND gate (B", or N') said second NAND gate (C", or O') are within said signal path then both are testable for logical operation by observation of the results of digital signal propagation thereupon said signal path.

4. The improvement to the process of scan-set testing an edge-triggered flip-flop of claim 3 further comprising:

observing the signal propagation delay between said input scan-set test data signal (SS DATA IN) and said output scan-set test data signal (SS DATA OUT) as indicative of both the signal drive capacity of said first input NAND gate (B", or N') in combination with said serially interconnected second input NAND gate (said C", or O'), plus the impedance experienced by the signal drive thereof said first input NAND gate (said B", or N') and said serially interconnected second input NAND gate (said C", or O').

5. A digital circuit apparatus in modification of, and with logic augmentations to, the logic structure of an edge-triggered dual D-type flip-flop industry standard part number 74 solely to the end that a first NAND gate (gate B) serially interconnected to a second NAND gate (gate C) within said flip-flop logic structure as both do uniquely receive the system clock signal (SYST CLK) should be selectively exercisable under the control of a test enablement signal (TEST 2) to propagate a test data signal (SS DATA IN) serially through said first NAND gate (said B) and then said second NAND gate (said C) without suffering interference from the remaining NAND gates thereof said flip-flop logic structure, said apparatus comprising:

test enablement signal providing means for providing an active test enablement signal (TEST 2);

test data signal providing means for providing a test data signal (SS DATA IN);

a third NAND gate (gate K) which is enabled by active said test enablement signal (TEST 2) for gating said test data signal (SS DATA IN) to a logically OR'ed interconnection with that signal net of the edge-triggered dual D-type flip-flop industry standard part number 74, which signal net is identifiable as: wherein said first NAND gate (gate B) and said serially interconnected second NAND gate (gate C) of said flip-flop logic structure do uniquely receive the system clock signal (SYST CLK), wherein said first NAND gate (B) does have an output signal connection to said other, second NAND gate (C) while also being cross-coupled to a fourth NAND gate (gate A), then said signal net is between the output of said fourth NAND gate (A) and the input to said cross-coupled first NAND gate (B);

said fourth NAND gate (A) plus a fifth NAND gate (D) part of said edge-triggered dual D-type flip-flop industry standard part number 74 logic structure—which said fourth NAND gate (A) and said fifth NAND gate (D) are identifiable as those which are respectively cross-coupled to said first NAND gate (B) and said second NAND gate (C)—modified to accept as an input signal said test enablement signal (TEST 2) and to be disabled by the active condition thereof said test enablement signal (TEST 2);

wherein said test data signal (SS DATA IN) as logically OR'ed in interconnection to said signal net is gated through both said first NAND gate (B) and then said second NAND gate (C) serially interconnected thereto upon the enabling occurrence of said system clock signal (SYST CLK) which is received at both said first NAND gate (B) and said second NAND gate (C);

thereby since said fourth NAND gate (A) and said fifth NAND gate (D) are disabled by said active condition of such test enablement signal (TEST 2) and thusly not gating of signals, then no signal outputs from either said fourth NAND gate (A) or said fifth NAND gate (D) are interfering with said gating of said test data signal (SS DATA IN) through said first NAND gate (B) and said second NAND gate (C) to which said fourth NAND gate (A) and said fifth NAND gate (D) are respectively cross-coupled.

6. A digital circuit apparatus in modification of, and with logic augmentations to, the logic structure of an edge-triggered J-$\overline{K}$ flip-flop industry standard part number 109 solely to the end that a first NAND gate (gate N) serially interconnected to a second NAND gate (gate O) within said flip-flop logic structure as both do uniquely receive the system clock signal (SYST CLK) should be selectively exercisable under the control of a test enablement signal (TEST 2) to propagate a test data signal (SS DATA IN) serially through said first NAND gate (said N) and then said second NAND gate (said O) without suffering interference from the remaining NAND gates thereof said flip-flop logic structure, said apparatus comprising:

test enablement signal providing means for providing an active test enablement signal (TEST 2);

test data signal providing means for providing a test data signal (SS DATA IN);

a third NAND gate (gate T1) which is enabled by active said test enablement signal (TEST 2) for gating said test data signal (SS DATA IN) to a logically OR'ed interconnection with that signal net of the edge-triggered J-$\overline{K}$ flip-flop industry standard part number 109, which signal net is identifiable as: wherein said first NAND gate (gate N) and said serially interconnected second NAND gate (gate O) of said flip-flop logic structure do uniquely receive the system clock signal (SYST CLK), wherein said first NAND gate (N) does have an output signal connection to said other, second NAND gate (O) while also being cross-coupled to a fourth NAND gate (gate M), then said signal net is between the output of said fourth NAND gate (M) and the input to said cross-coupled first NAND gate (N);

wherein said fourth NAND gate (M) receives signals from two fifth NAND gates (P and Q) part of said edge-triggered J-$\overline{K}$ flip-flop industry standard part number 109 logic structure—which said fourth NAND gate (M) and said two fifth NAND gates (P and Q) are identifiable as those which are respectively cross-coupled to said first NAND gate (N) and said second NAND gate (O)—said two fifth NAND gates (P and Q) modified to accept as an input signal said test enablement signal (TEST 2) and to be disabled by the active condition thereof said test enablement signal (TEST 2);

wherein said test data signal (SS DATA IN) as logically OR'ed in interconnection to said signal net is gated through both said first NAND gate (N) and then said second NAND gate (O) serially interconnected thereto upon the enabling occurrence of said system clock signal (SYST CLK) which is received at both said first NAND gate (N) and said second NAND gate (O);

thereby since said fourth NAND gate (M) and said two fifth NAND gates (P and Q) are disabled by said active condition of such test enablement signal (TEST 2) and thusly not gating of signals, then no signal outputs from either said fourth NAND gate (M) or either of said two fifth NAND gates (P and Q) are interfering with said gating of said test data signal (SS DATA IN) through said first NAND gate (N) and said second NAND gate (O) to which said fourth NAND gate (M) and said two fifth NAND gates (P and Q) are respectively cross-coupled.

7. In an edge-triggered flip-flop embedded into a scan-set shift register functioning as a race-free bistable latch during scan-set testing, said scan-set testing being in response to, and during, an active first test enablement signal—a signal called TEST 1—plus in response to, and during active scan-set clock signals—signals called SS CLK A and SS CLK B—to shift an input scan-set test data signal—a signal called SS DATA IN—to an output scan-set test data signal—a signal called SS DATA OUT, and said scan-set testing necessarily disabling via and during said active condition of said first test enablement signal, both a first input NAND gate—called NAND gate B″—coupled to a second input NAND gate—called NAND gate C″—of said edge-triggered flip-flop, which two NAND gates also receive an active system clock signal—a signal called SYST CLK—in order that, by said disabling via said active condition of said first test enablement signal, both said NAND gates also receiving said active system clock signal will not be satisfied in the development of signals which would conflict with said scan-set testing of said edge-triggered flip-flop, an improved logic apparatus for controlling and interconnecting to those said two input NAND gates which two input NAND gates also receive both said system clock signal—said SYST CLK—and said first test enablement signal—said TEST 1—to the end that said two input NAND gates may be tested compatibly with, at a time after, said scan-set testing of said edge-triggered flip-flop, said apparatus comprising:

second test enablement signal source means for supplying, at a time after said scan-set testing, an active second test enablement signal—a signal called TEST 2;

first connection means for supplying said active test enablement signal, said signal TEST 2, and in a polarity which will disable, all additional NAND gates of said edge-triggered flip-flop which are cross-coupled with either said first, said second, or both said first and said second of said input NAND gates, said cross-coupling meaning that each said additional NAND gate does receive output signals from, and supply input signals to, one(s) of said first and said second input NAND gates;

first supplementary NAND gate means—called NAND gate K—for forming a second test stimuli signal as the inversion of the logical ANDing of said scan-set test data signal—said signal SS DATA IN—and said active second test enablement signal—said signal TEST 2;

second connection means for supplying said second test stimuli signal to said first of said input NAND gates—said B″ NAND gate—of said edgetriggered flip-flop;

merging connection means for observing the output signal of said second of said input NAND gates—said C″ NAND gate—of said edge-triggered flip-flop as the output scan-set test data signal—said signal SS DATA OUT;

whereby since said first input NAND gate—said B″ NAND gate—is coupled to said second input NAND gate—said C″ NAND gate—then a complete inverter string consisting of said first supplementary NAND gate means—said NAND gate K—then said first input NAND gate—said NAND gate B″—then said second input NAND gate—said NAND gate C″—exists between said input scan-set test data signal—said signal SS DATA IN—and said output scan-set test data signal—said signal SS DATA OUT;

whereby observation of scan-set test data signal flow through said inverter string the correct operation of the NAND gates therein, and particularly said first input NAND gate and said second input NAND gate which are of said edge-triggered flip-flop, may be verified;

whereby said testing responsive to said active second test enablement signal after said scan-set testing does test the correct operation of two NAND gates, said first input NAND gate and said second input NAND gate, which are not tested during said scan-set testing.

* * * * *